(12) United States Patent
Fernier et al.

(10) Patent No.: US 7,054,527 B2
(45) Date of Patent: May 30, 2006

(54) PASSIVE COMPENSATING COUPLING LASER DEVICE

(75) Inventors: Bruno Fernier, Bourg la Reine (FR); Sylvaine Kerboeuf, L'Hay les Roses (FR); Jean-Marc Rainsant, Antony (FR); Francois Boubal, Paris (FR); Alwin Göth, Altensteig (DE); Joachim Scherb, Esslingen-Zell (DE)

(73) Assignee: Avanex Corporation, Fremont, CA (US)

( * ) Notice: Subject to any disclaimer, the term of this patent is extended or adjusted under 35 U.S.C. 154(b) by 192 days.

(21) Appl. No.: 10/221,376

(22) PCT Filed: Jan. 17, 2002

(86) PCT No.: PCT/FR02/00184

§ 371 (c)(1),
(2), (4) Date: Jan. 21, 2003

(87) PCT Pub. No.: WO02/057827

PCT Pub. Date: Jul. 25, 2002

(65) Prior Publication Data

US 2003/0179463 A1    Sep. 25, 2003

(30) Foreign Application Priority Data

Jan. 19, 2001  (FR) .................................. 01 00736

(51) Int. Cl.
*G02B 6/42* (2006.01)
(52) U.S. Cl. .......................................... 385/39; 385/94
(58) Field of Classification Search .................. 385/15, 385/17, 33, 39, 51, 94; 359/664

See application file for complete search history.

(56) References Cited

U.S. PATENT DOCUMENTS

| 5,150,376 A | | 9/1992 | Ohmori et al. |
| 5,195,155 A | | 3/1993 | Shimaoka et al. |
| 5,202,939 A | * | 4/1993 | Belleville et al. ............. 385/12 |
| 5,307,438 A | * | 4/1994 | Bilkadi et al. ............. 385/141 |
| 5,313,333 A | | 5/1994 | O'Brien et al. |
| 5,410,563 A | | 4/1995 | Nakamura et al. |
| 6,504,975 B1 | * | 1/2003 | Yamagata et al. ............ 385/33 |

(Continued)

FOREIGN PATENT DOCUMENTS

EP        0280366 A1    8/1988

(Continued)

OTHER PUBLICATIONS

M. Fukuda et al, "Highly Reliable Plastic Packaging for Laser Diode and Photodiode Modules Used for Access Network", Electronics Letters, IEE Stevenage, GB, vol. 33, No. 25, Dec. 4, 1997, pp. 2158-2159, XP006008260.

(Continued)

*Primary Examiner*—Brian Healy
*Assistant Examiner*—Eric Wong
(74) *Attorney, Agent, or Firm*—Patterson & Sheridan LLP

(57) ABSTRACT

In an optical or optoelectronic module (1) an intermediate medium (4, 10) whose optical index decreases with temperature is introduced into the optical path (7) between a laser diode (9) and an optical fiber (5). This compensates, by passive means, the power losses of the laser emission due to the increase in operating temperature by improving the transmission between the diode (9) and the fiber (5). The intermediate medium (4, 10) is preferably deposited in the form of a capsule (10) enveloping the diode (9) and the end of the fiber (5).

This achieves, by passive means, a transmitted power that is independent of the operating temperature.

12 Claims, 2 Drawing Sheets

U.S. PATENT DOCUMENTS 6,714,699 B1 * 3/2004 Cao et al. ............... 385/17
6,733,190 B1 * 5/2004 Kuhara et al. ............ 385/94
2001/0033722 A1 * 10/2001 Okada et al. ............ 385/94

FOREIGN PATENT DOCUMENTS

| EP | 0586276 | A2 | 3/1994 |
| EP | 0859255 | A2 | 8/1998 |
| FR | 2783094 | A1 | 3/2000 |
| WO | WO 9939230 | | 8/1999 |

OTHER PUBLICATIONS

Patent Abstracts of Japan, vol. 015, No. 2100 May 29, 1991 corresponding to JP03056901 dated Mar. 12, 1991.

* cited by examiner

PASSIVE COMPENSATING COUPLING LASER DEVICE

TECHNICAL FIELD

The invention relates to optoelectronic or optical systems including coupling means between an optical or optoelectronic component emitting a modulated or unmodulated laser wave and a waveguide for the emitted light, for example an optical fiber.

PRIOR ART

The laser diodes used in inexpensive optical modules, for example modules surface-mounted on a printed circuit (SML modules), have an external efficiency, i.e. a ratio between the variation of the power available at a fiber collecting the emitted optical power and the variation of the current injected into the laser diode, which is a function of the operating temperature of the module. Experimental results obtained with an SML module show a reduction in the external efficiency of the module by approximately three decibels when the temperature ranges from 25° C. to 85° C. This loss of efficiency is directly related to the behavior of the semiconductor laser diode as a function of temperature. With a constant bias current, the external efficiency of the laser diode decreases as the temperature increases.

The person skilled in the art knows various solutions for obtaining a module of constant external efficiency.

An external efficiency of a module that is independent of the operating temperature can be obtained by using an electronic loop to regulate the modulation current. This is known to the person skilled in the art. The loop must vary the DC bias current and the modulation current as a function of temperature. The best behavior of the module is obtained by accurately adjusting the modulation current at temperatures throughout the range of operating temperatures of the module. This method achieves good results but the regulation loop is sophisticated and therefore costly. This makes it unsuitable for use in inexpensive modules.

Thought has also been given to using a laser with a mirror whose reflectivity is a function of temperature. See the paper by A. KASUKAWA, N. IWAI and N. YAMANAKA published in Electronic Letters, Jun. 23, 1994, Vol. 30, N° 13 under the title "Very high characteristic temperature and constant differential quantum efficiency 1.3 µm GaInAsP/lnP strained layer quantum well lasers by use of temperature dependant reflectivity mirror". Using the above kind of mirror is unfortunately compatible only with Fabry-Perot lasers and not with distributed feedback (DFB) lasers. The mirror has less influence on the behavior of the distributed feedback laser and cannot be used to control the behavior of the laser as a function of temperature.

Systems have been produced in which the temperature of the laser is maintained constant by cooling means such as Peltier modules. The use of such modules is incompatible with small inexpensive components.

BRIEF DESCRIPTION OF THE INVENTION

In contrast to the prior art just described, the invention aims to provide an optical or optoelectronic module whose external efficiency is independent or virtually independent of the operating temperature of the module throughout its range of operating temperatures. The invention aims to achieve this economically and using means having a small overall size that does not increase the outside dimensions of the module, which is reproducible and reliable.

The invention achieves a constant external efficiency of the optical module throughout its range of operating temperatures by passive means. Passive compensator means are used to couple the optical component, for example a laser, in particular a laser diode, and the fiber. They increase the efficiency of coupling when the temperature increases to compensate exactly the loss of luminous power emitted by the coupled component. It therefore becomes possible to modulate the laser using a constant modulation current. If the external efficiency of the component increases with temperature, it is then naturally possible to use passive compensator means in accordance with the invention to reduce the coupling if the temperature increases.

The invention adds to the optical path of the output wave from the optical or optoelectronic component between the fiber and the component a medium whose optical refractive index is a function, preferably a monotonous function, of temperature, increasing or decreasing in a non-negligible manner, for example from $10^{-4}$ per degree to a few $10^{-4}$ per degree.

When the function is a decreasing function, the maximum coupling between the fiber and the optical component is optimized for the highest designed operating temperature, for example 85° C. If the function is an increasing function, the maximum coupling between the fiber and the optical component is optimized for the lowest designed operating temperature, for example 25° C.

When the medium whose optical refractive index is a function of temperature is placed on the optical path between the optical component and the fiber in the form of a separate block, the loss of coupling caused by the variation in temperature, starting from the temperature giving the maximum coupling, compensates only the variation in optical efficiency of the laser alone. On the other hand, if the medium whose optical refractive index is a function of temperature takes the form of a capsule enveloping the optical component and also an end of the fiber facing the component, it is necessary to take account of the variation in the operation of the laser induced by the medium and the variation in the optical path between the component and the fiber due to the presence of the medium.

With the invention, if the external efficiency of the laser varies, for example decreases, because of an increase in the operating temperature of the module, the proportion of the power transmitted to the fiber via said medium varies, for example increases, and by choosing the medium placed between the fiber and the component correctly it is possible to vary the proportion of the optical power received by the fiber in a compensatory manner, for example to increase it in a compensatory manner, with the result that the power received by the fiber is independent of the operating temperature of the module. In other words, an optical medium with a high thermo-optical coefficient, for example a polymer, varies the coupling between the optical component and the fiber by passive means when the temperature varies and the optical power emitted by the laser varies accordingly, all other things being equal.

Note that the relative positions of the optical components (the laser, one or more lenses between the laser and the fiber, and the fiber) is not without effect on transmission. An approximation of the best positions can be calculated as a function of parameters of the materials on the optical path, for instance the lens or lenses, for example using dedicated software.

To summarize, the invention relates to an optical or optoelectronic module including an optical or optoelectronic component coupled by coupling means to an optical waveguide via an optical path joining the component and the optical waveguide, which module is characterized in that the coupling means between the component and the optical waveguide include an intermediate medium transparent to the optical wave and whose refractive index varies with temperature. As explained above, the variation of the index with temperature is generally a monotonously increasing or decreasing variation and therefore induces a monotonously increasing or decreasing coupling.

As a result of this the variation in the coupling between the fiber and the component induced by the variation in the optical index of the intermediate medium produces a maximum coupling between the fiber and the component when the operating temperature of the module is one of the extreme temperatures of a designed range of operating temperatures of the module.

As a general rule, the external efficiency of the component decreases with temperature. If the refractive index of the intermediate medium is a decreasing function of temperature, the maximum coupling between the fiber and the optical component is set for the highest operating temperature of a designed range of operating temperatures of the module.

On the other hand, if the external efficiency of the component decreases with the temperature and the refractive index of the intermediate medium is an increasing function of temperature, the maximum coupling between the fiber and the optical component is set for the lowest operating temperature of a designed range of operating temperatures of the module.

If, as also happens, the external efficiency of the component increases with temperature and the refractive index of the intermediate medium is a decreasing function of temperature, the maximum coupling between the fiber and the optical component is set for the lowest operating temperature of a designed range of operating temperatures of the module.

On the other hand, if the external efficiency of the component increases with temperature and the refractive index of the intermediate medium is an increasing function of temperature, the maximum coupling between the fiber and the optical component is set for the highest operating temperature of a designed range of operating temperatures of the module.

The intermediate medium can be a block of polymer, for example a block of silicone elastomer. If the polymer takes the form of a separate block on the optical path between the fiber and the component, the entry and exit faces of the block are preferably coated with an antireflection layer.

The intermediate medium preferably takes the form of a capsule of a material surrounding one end of the fiber, at least the face of the optical component facing said one end of the fiber, and any components such as lenses or other components on the optical path between the component and the fiber.

The optical index of the intermediate medium deposited in the form of a capsule is preferably the same as or very similar to the optical index of the optical fiber so as not to introduce stray reflections liable to interfere with the operation of the component. For any temperature in the range of operating temperatures of the module, for example in the range from 25° C. to 85° C., the optical index of the medium is preferably equal to that of the fiber. The equality preferably applies at the designed operating temperature of the module or at a temperature in the middle of the designed range of operating temperatures.

BRIEF DESCRIPTION OF THE DRAWINGS

Embodiments of the invention are described next with reference to the accompanying drawings, in which.

DESCRIPTION OF EMBODIMENTS OF THE INVENTION

Figure 1:
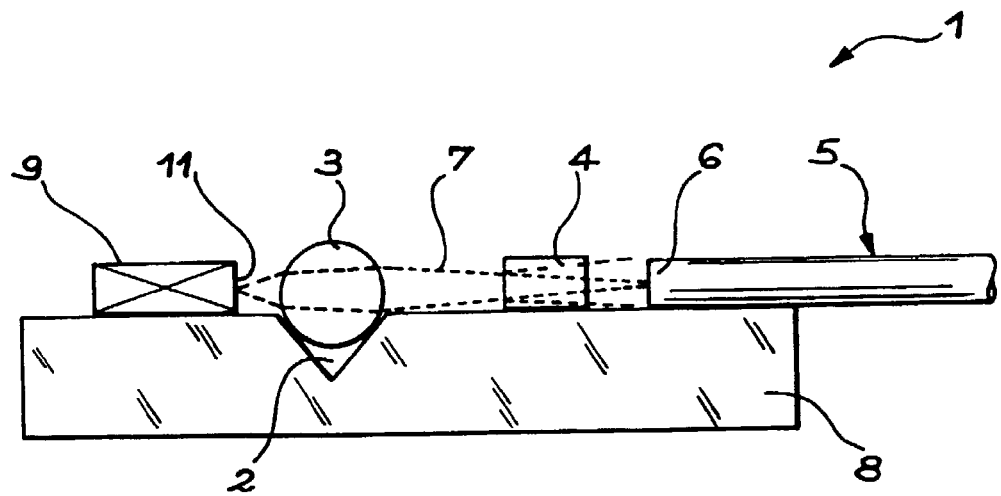
FIG. 1 represents a diagrammatic side view in section of a portion of an optical module according to the invention including an intermediate medium taking the form of a separate block.

FIG. 1 represents a diagrammatic sectional view of a portion of a module 1. An optoelectronic component 9, for example a laser diode, is mounted on a base 8 in order to communicate with a laser fiber 5. This is known in the art.

According to the invention, a block 4 of a material having a refractive index that varies linearly with temperature is inserted in an optical path 7 and, when there is a lens 3 on the optical path, in series with the lens.

In the examples to be described it is assumed that the external efficiency of the laser decreases with temperature, which is the most usual case. The maximum coupling between the fiber 5 and the component 9 then corresponds to the highest designed operating temperature. The maximum coupling can be obtained with a medium whose index decreases as the temperature increases.

In the example shown the lens 3 couples an end 6 of the optical fiber and a face 11 of the laser diode 9. The lens 3 is placed at the bottom of a recess 2. The optical path 7 between the face 11 of the component 9 and the end 6 of the fiber 5 is represented by two sets of dashed lines. The first set represents a situation in which all of the light emitted by the laser diode 9 is introduced into the fiber 5. This configuration of the optical path corresponds to a temperature of maximum coupling between the fiber 5 and the component 9, i.e. the highest operating temperature of the module 1. The second set of dashed lines diagrammatically representing the optical path 7 corresponds to a situation in which only a portion of the light emitted by the laser diode 9 is introduced into the fiber 5. This configuration of the optical path 7 corresponds to a temperature for which the coupling between the fiber 5 and the component 9 is reduced, for example an operating temperature of the module 1 that is lower than the highest operating temperature and inside the designed range of operating temperatures.

The lens 3 in this example has a diameter of 500 μm and a refractive index of 1.8.

As explained above, the relative positions of the laser 9, the intermediate coupling elements such as the lens 3 and the block 4, and the end 6 of the fiber 5, are determined so that if the temperature increases, and the external efficiency of the laser therefore decreases, the variation in the optical index of the medium 4 varies the optical path between the component 9 and the fiber 5 in a manner that improves the coupling to compensate the loss of efficiency.

The reduced power emitted by the laser is compensated with the same bias current. Thus the power losses of the laser emission due to the increased operating temperature are compensated by passive means.

Currently the range of variation of the optical index with temperature runs from $10^{-4}$ per degree to a few $10^{-4}$ per degree. It follows that a compensatory variation in the optical path can be obtained only if the distance between the component and the fiber is greater than approximately 2 mm. If new materials appear with higher index variations, it will then be possible to reduce the distance between the component and the fiber.

Figure 2:
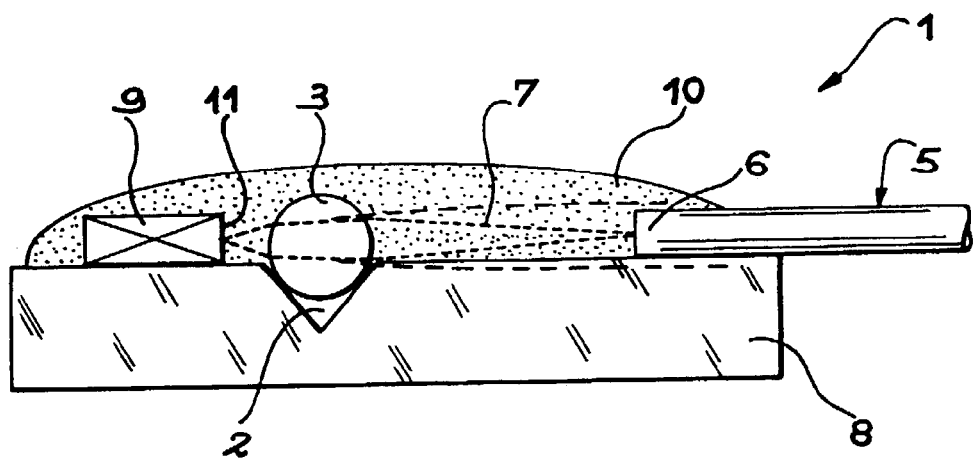
FIG. 2 represents a diagrammatic view in section of a portion of an optical module according to the invention including an intermediate medium taking the form of a capsule enveloping the component and one end of the fiber.

FIG. 2 represents a first variant of the preferred embodiment of the invention. Items in this figure already described with reference to FIG. 1 are not described again.

In the embodiment shown in FIG. 2, the intermediate medium represented in FIG. 1 in the form of a separate block 4 is deposited on the base 8 in the form of a capsule 10 of a material whose optical index is a monotonous and increasing or decreasing function of temperature. This solution has the following advantages compared to the solution described with reference to FIG. 1.

First of all, the light emitted by the laser diode 9 is emitted directly into the material of the capsule 10, so that there is no reflection liable to interfere with the operation of the laser. To exploit this lack of reflection fully it is preferable for the optical index of the medium constituting the capsule 10 to be the same or very close to that of the optical fiber 5. Another advantage is that the capsule is easy to deposit. Note that from an optical point of view it is sufficient for the capsule to cover entirely the optical path 7 between the face 11 of the optical component 9 and the end 6 of the fiber 5. It is also possible, as shown in FIG. 2, to encapsulate completely the component 9 and the end 6 of the fiber 5.

In this example, the operating temperatures of the module 1 range from 25° C. to 85° C., representing a temperature difference of 60° C. By choosing for the intermediate medium 10 a material whose refractive index variation is greater than $10^{-4}$ and preferably from $2\times10^{-4}/°$ C. to $4\times10^{-4}/°$ C., an index variation from $1.2\times10^{-2}$ to $2.4\times10^{-2}$ is obtained over this range of temperatures. With this refractive index variation it is possible to increase the coupling efficiency by approximately 3 dB when the temperature rises from 25° to 85°. Note that this increase in transmission corresponds to the decrease in the power emitted by the laser diode for the same increase in temperature.

Figure 3:
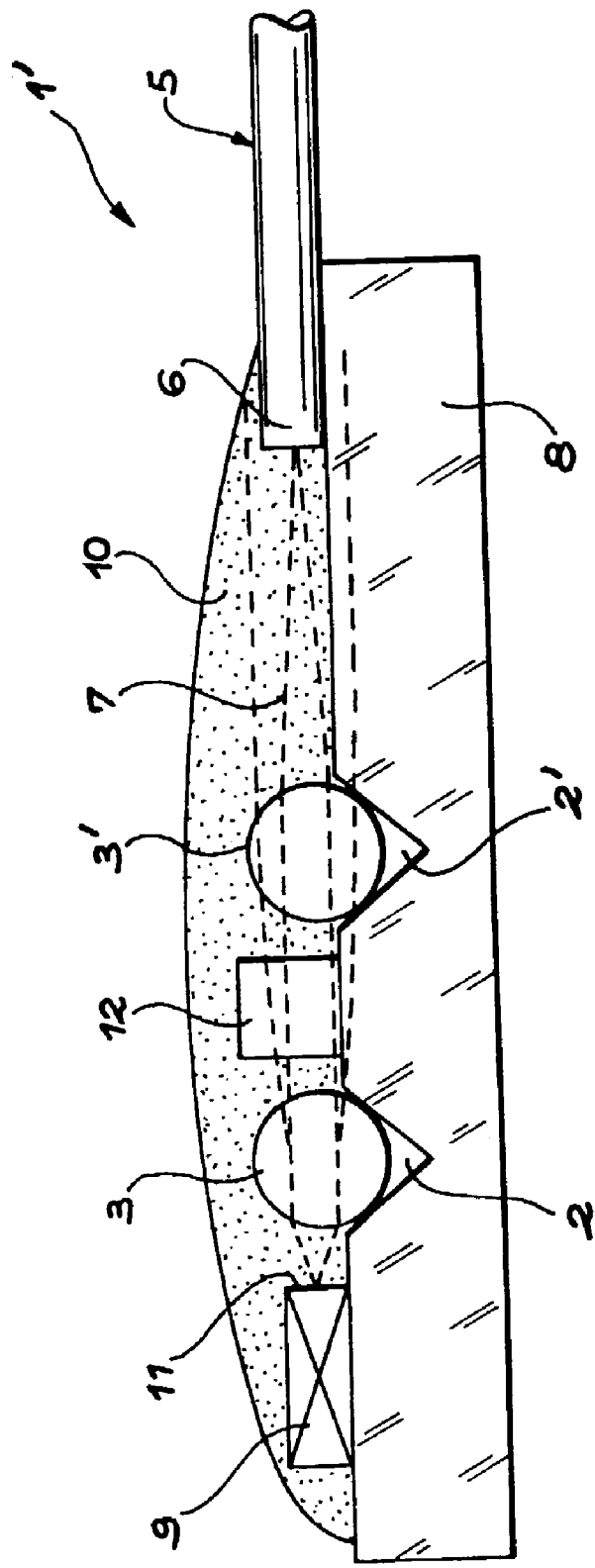
FIG. 3 represents a diagrammatic view in section of a portion of an optical module conforming to a preferred embodiment of the invention and including an intermediate medium taking the form of a capsule enveloping the component and an end of the fiber, the coupling means between the laser and the fiber comprising two intermediate lenses in addition to the intermediate medium.

In a second variant 1' of the preferred embodiment of the invention, shown in FIG. 3, the component 9 and the end 5 of the fiber 6 are encapsulated in a capsule 10 of a material whose optical index varies monotonously with temperature, as in FIG. 2. In this embodiment a supplementary lens 3' is added in a recess 2' on the optical path 7 between the component 9 and the end 6 of the fiber 5. This variant facilitates adjusting the variation of the optical path to compensate the variation in the external efficiency of the laser over the whole of the range of operating temperatures. As shown in FIG. 3, an isolator 12 can optionally be added between the lenses 3 and 3' to isolate the component 9 from light returning from the fiber 5 and liable to interfere with the operation of the laser diode 9.

Items in FIG. 3 having the same reference number as items already described are not described again.

The invention claimed is:

1. An optical or optoelectronic module including an optical or optoelectronic component coupled by a coupler to an optical waveguide via an optical path joining the component and the optical waveguide characterized in that the coupling between the component and the optical waveguide includes an intermediate medium transparent to an optical wave and whose refractive index varies with temperature, refractive index temperature dependence (RITD) of the intermediate medium is from $2\times10^{-4}$ to $4\times10^{-4}$ (positive or negative) for each increase in temperature of one degree C.

2. An optical or optoelectronic module according to claim 1, characterized in that an external efficiency of the component decreases with temperature and the refractive index of the intermediate medium is an increasing function of temperature, wherein a maximum coupling between the optical waveguide and the component is set for a lowest operating temperature of a designed range of operating temperatures of the module.

3. An optical or optoelectronic module according to claim 1, characterized in that an external efficiency of the component increases with temperature and a maximum coupling between the optical waveguide and the component is set for an extreme operating temperature of a designed range of operating temperatures of the module, wherein the extreme operating temperature is a lowest operating temperature if the refractive index of the intermediate medium is a decreasing function of temperature and the extreme operating temperature is a greatest operating temperature if the refractive index of the intermediate medium is an increasing function of temperature.

4. An optical or optoelectronic module according to claim 1, characterized in that the intermediate medium is an elastomer.

5. An optical or optoelectronic module according to claim 1, characterized in that the intermediate medium comprises a capsule enveloping one end of the optical waveguide and at least one face of the component facing the optical waveguide.

6. An optical or optoelectronic module according to claim 5, further characterized in that two lenses are included in the optical path between the component and the end of the optical waveguide.

7. An optical or optoelectronic module according to claim 6, further characterized in that an isolator is included in the optical path between the two lenses.

8. An optical or optoelectronic module according to claim 1, characterized in that the distance between the component and the end of the optical waveguide is greater than 2 mm.

9. An optical or optoelectronic module according to claim 1, characterized in that for any temperature in a range of operating temperatures of the module the refractive index of the medium included in the optical path between the component and the optical waveguide is equal to an optical index of the optical waveguide.

10. An optical or optoelectronic module according to claim 1, wherein the intermediate medium is spaced away from the optical waveguide.

11. An optical or optoelectronic module according to claim 1, wherein:

an external efficiency of the component decreases with temperature and the refractive index of the intermediate medium is a decreasing function of temperature, and a maximum coupling between the optical waveguide and the component is set for a greatest operating temperature of a designed range of operating temperatures of the module.

12. An optical or optoelectronic module according to claim 9, wherein the operating range of the module is 25° C. to 85° C.

* * * * *